United States Patent
Wu et al.

(10) Patent No.: US 9,804,227 B2
(45) Date of Patent: Oct. 31, 2017

(54) ELECTRIC MACHINE FAST TRANSIENT CONDITION DETECTION

(75) Inventors: Ji Wu, Dearborn, MI (US); Joe Youqing Xiang, Canton, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 2139 days.

(21) Appl. No.: 12/889,482

(22) Filed: Sep. 24, 2010

(65) Prior Publication Data

US 2011/0175617 A1    Jul. 21, 2011

(51) Int. Cl.
*G01R 31/34* (2006.01)
*G01R 31/02* (2006.01)

(52) U.S. Cl.
CPC .......... *G01R 31/343* (2013.01); *G01R 31/025* (2013.01)

(58) Field of Classification Search
CPC ............... G01R 31/2836; H02P 29/021; H02P 2009/002
USPC ........ 324/756.01, 500, 511; 701/22
See application file for complete search history.

(56) References Cited

U.S. PATENT DOCUMENTS

| | | | | |
|---|---|---|---|---|
| 4,256,951 A * | 3/1981 | Payne | ..................... | G05F 1/452 219/486 |
| 4,334,147 A * | 6/1982 | Payne | ................. | G05D 23/1913 219/485 |
| 5,477,115 A * | 12/1995 | McClean | ............. | H02H 7/0816 318/461 |
| 5,547,265 A * | 8/1996 | Harris et al. | ..................... | 303/10 |
| 6,076,504 A * | 6/2000 | Stavnheim | ............ | F02D 41/221 123/198 D |
| 6,102,000 A * | 8/2000 | Shindoh et al. | ............... | 123/381 |
| 6,232,733 B1 * | 5/2001 | Obayashi et al. | ............ | 318/432 |
| 6,293,251 B1 * | 9/2001 | Hemmerlein | ......... | F02D 41/222 123/357 |
| 6,935,311 B2 * | 8/2005 | Visser et al. | ............. | 123/406.47 |
| 8,100,112 B2 * | 1/2012 | Nakata | ................ | F02D 41/2451 123/458 |
| 8,176,726 B2 * | 5/2012 | Gerlach | ................ | B01D 53/90 60/274 |
| 8,881,707 B2 * | 11/2014 | Katsurahara | .......... | F02D 41/221 123/198 D |
| 9,168,950 B1 * | 10/2015 | Chanda | ................ | B60W 30/02 |
| 2001/0049316 A1 * | 12/2001 | Yamamoto | ........ | F16H 61/66272 477/45 |
| 2002/0019687 A1 * | 2/2002 | Suzuki et al. | .................. | 701/22 |
| 2005/0256618 A1 | 11/2005 | Hsieh et al. | | |
| 2008/0281480 A1 * | 11/2008 | Egami et al. | .................. | 701/22 |
| 2009/0319109 A1 * | 12/2009 | Ando et al. | ..................... | 701/22 |
| 2010/0087996 A1 | 4/2010 | Haggerty et al. | | |
| 2010/0088009 A1 * | 4/2010 | Hirota et al. | ................. | 701/104 |
| 2010/0114424 A1 | 5/2010 | Morris et al. | | |
| 2010/0220406 A1 * | 9/2010 | Cuddihy et al. | ............. | 359/843 |
| 2010/0320019 A1 * | 12/2010 | Gale et al. | ................. | 180/65.27 |

* cited by examiner

*Primary Examiner* — Giovanni Astacio-Oquendo
(74) *Attorney, Agent, or Firm* — David B. Kelley; Brooks Kushman P.C.

(57) ABSTRACT

During a transient operating condition in an electric machine, a diagnostic routine associated with the electric machine may erroneously indicate a fault. According to the disclosure, a flag is set when a transient condition is detected. The flag is communicated to the diagnostic routine. The output of the diagnostic routine may be altered when the flag is set, i.e., when a transient is detected.

13 Claims, 3 Drawing Sheets

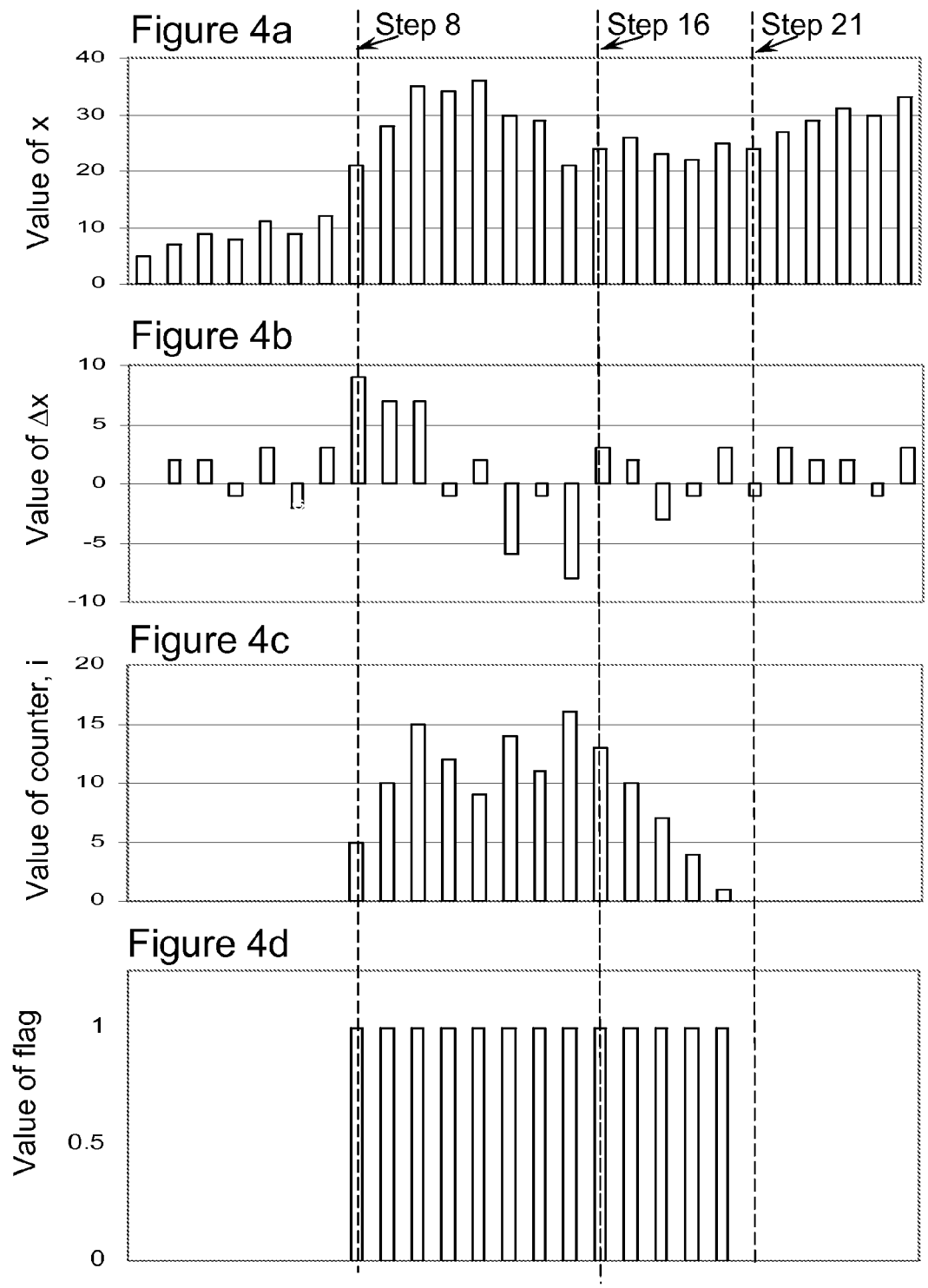

ELECTRIC MACHINE FAST TRANSIENT CONDITION DETECTION

BACKGROUND

1. Technical Field

The disclosure relates to diagnosing faults in electric machines.

2. Background Art

It is known to diagnose faults in the operation in electric motors so that mitigating actions can be taken. For example, the actual current in the motor is compared to that commanded. An error indicates a fault, such as a short in the motor. In response, a fault condition may be communicated to an operator or the motor may be shut down in extreme cases.

Transient conditions, however, may lead to false indications of faults. For example, in current feedback error checking, the actual current may not follow the current command closely during a transient, not because of an actual fault, but due to issues associated with a transient condition. It is desirable to avoid false indications of fault conditions.

SUMMARY

A method for detecting a transient condition in an electric machine is disclosed, which includes: determining delta x, a rate of change in a quantity associated with the electric machine, incrementing a counter by an up count when the absolute value of delta x is greater than a first threshold, decrementing a counter by a down count when delta x is less than a second threshold, and setting a flag when the counter is greater than zero. The quantity upon which the detection is based may be current, voltage, torque, speed, or a combination thereof. The first threshold may be equal to the second threshold or greater than the second threshold. The up count is greater than the down count or equal to the down count. The detection may also include communicating the flag to a diagnostic routine with the diagnostic routine responding by: commanding the electric machine to change operating condition; sending an alert to an operator; commanding the electric machine to shut down; and/or setting an error code. The diagnostic routine is one of a routine that compares commanded current to actual current, a routine that compares commanded voltage to actual voltage, a routine that checks for continuity in the electrical connections, and a routine that diagnoses shorts in the electric machine. The electric machine may be a motor that is supplied electrical current or a generator which generates electrical current.

A method to detect a transient condition in an electric machine may include: measuring a quantity associated with the machine at a first time; measuring the quantity at a second time; adjusting a counter based on the change in the quantity between the first and second times; setting a flag when the counter is positive; and communicating the flag to a diagnostic routine associated with the electric machine. In one embodiment, the counter is incremented by an up count when an absolute value of the difference in the quantity between the first and second times is greater than a first threshold and the counter is decremented by a down count when the absolute value of the difference in the quantity between the first and second times is less than a second threshold. The counter is set to zero when the counter is zero. Another way of describing this is to clamp the counter to zero.

An electric machine system includes: an electric machine and an electronic control unit coupled to the electric machine. The ECU receiving signals associated with the electric machine wherein the ECU determines whether the machine is undergoing a transient condition based on values of the signals, the ECU performs diagnostic routines related to the machine, and the response of the diagnostic routine is altered while the transient is detected. The diagnostic routine compares a commanded value of a quantity with an actual value of the quantity and the quantity is one of a current, a voltage, a torque, and a speed. The transient condition is determined by: computing a delta x based on a quantity associated with the electric machine changes with time; incrementing a counter by an up count when delta x is greater than a threshold; decrementing a counter by a down count when delta x is less than the threshold; and setting a flag when the counter is greater than zero.

BRIEF DESCRIPTION OF THE DRAWINGS

FIGS. 4*a-d* show representative data illustrating an embodiment of the present disclosure.

DETAILED DESCRIPTION

As those of ordinary skill in the art will understand, various features of the embodiments illustrated and described with reference to any one of the Figures may be combined with features illustrated in one or more other Figures to produce alternative embodiments that are not explicitly illustrated and described. The combinations of features illustrated provide representative embodiments for typical applications. However, various combinations and modifications of the features consistent with the teachings of the present disclosure may be desired for particular applications or implementations. Those of ordinary skill in the art may recognize similar applications or implementations consistent with the present disclosure, e.g., ones in which components or processes are arranged in a slightly different order than shown in the embodiments in the Figures. Those of ordinary skill in the art will recognize that the teachings of the present disclosure may be applied to other applications or implementations.

Figure 1:
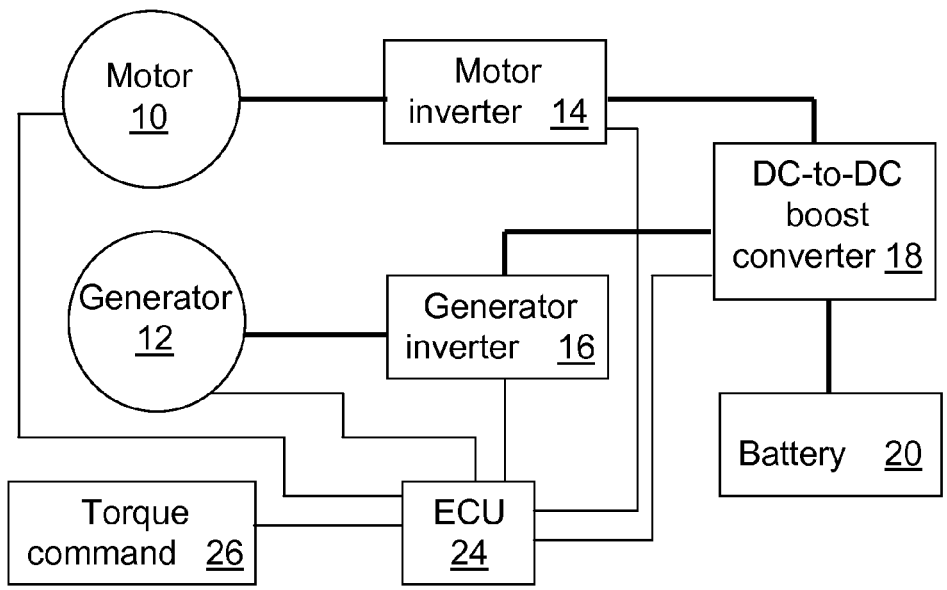
FIG. 1 is a schematic representation of electric machines and associated power electronics and control electronics.

The example embodiment in FIG. 1 includes both a motor 10 and a generator 12. In one embodiment, motor 10 is an electric machine to which electrical energy is supplied to drive the motor to provide torque at the motor's output shaft and generator 12 is an electric machine in which electric energy is generated due to torque that is applied to a shaft of the generator. In other embodiments, motor 10 and/or generator 12 are adapted to operate as both motors and generators. Motor 10 and generator 12 are AC electric machines that are coupled to a motor AC-to-DC inverter 14 and a generator AC-to-DC inverter, respectively. In embodiments, in which motor 10 and generator 12 are DC electric machines, no such inverter is provided. Inverters 14, 16 are coupled to DC-to-DC boost inverter 18, which is in turn coupled to an electrical storage device, such as a battery 20. An electric control unit (ECU) 24 is provided to manage inverters 14, 16. ECU 24 provides control outputs based on signals indicating an indication of torque demand, i.e., torque command 26, from an operator input, possibly from a human operator or another controller. Furthermore, ECU 24 receives inputs from motor 10 and generator 12 from which one or more of: speed, torque, current, voltage, etc. can be determined.

Figure 2:
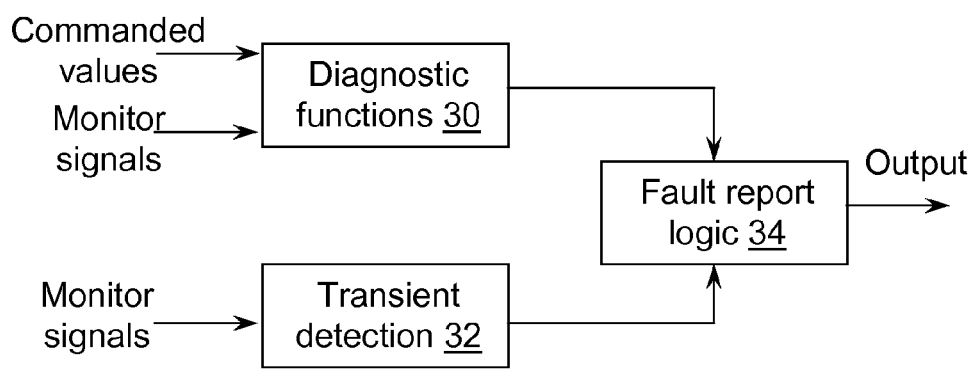
FIG. 2 is schematic representation of routines to diagnose faults in electric machines.

In FIG. 2, diagnostic functions 30 for an electric machine may include a variety of tests. In one example, a commanded current, as in input to diagnostic functions 30, is compared with the actual current, shown as a monitor signal input to diagnostic functions 30. It has been found that when the electric machine is undergoing a transient that such a diagnostic routine may provide a false indication of a fault, i.e., the actual current deviates from the commanded current, temporarily. Another example of a diagnostic routine involves detecting whether a cable is disconnected. In block 32, a transient is detected. In block 34, the fault report logic outputs a fault report based on signals received from diagnostic functions 30 and transient detection 32. In the absence of the transient detection information, when a fault condition is determined based on input from a diagnostic routine, the fault report logic may command the electric machine to be shut down or simply set an error code or illuminate an error light, as just a few examples. Due to possibly deleterious effects that transients have on the accuracy of diagnostic routines, the fault report logic 34 has the additional information that the electric machine is undergoing a transient. Thus, during the transient, one possibility is for the fault report logic 34 to ignore one or more of the diagnostic function 34 results while a transient is detected.

Figure 3:
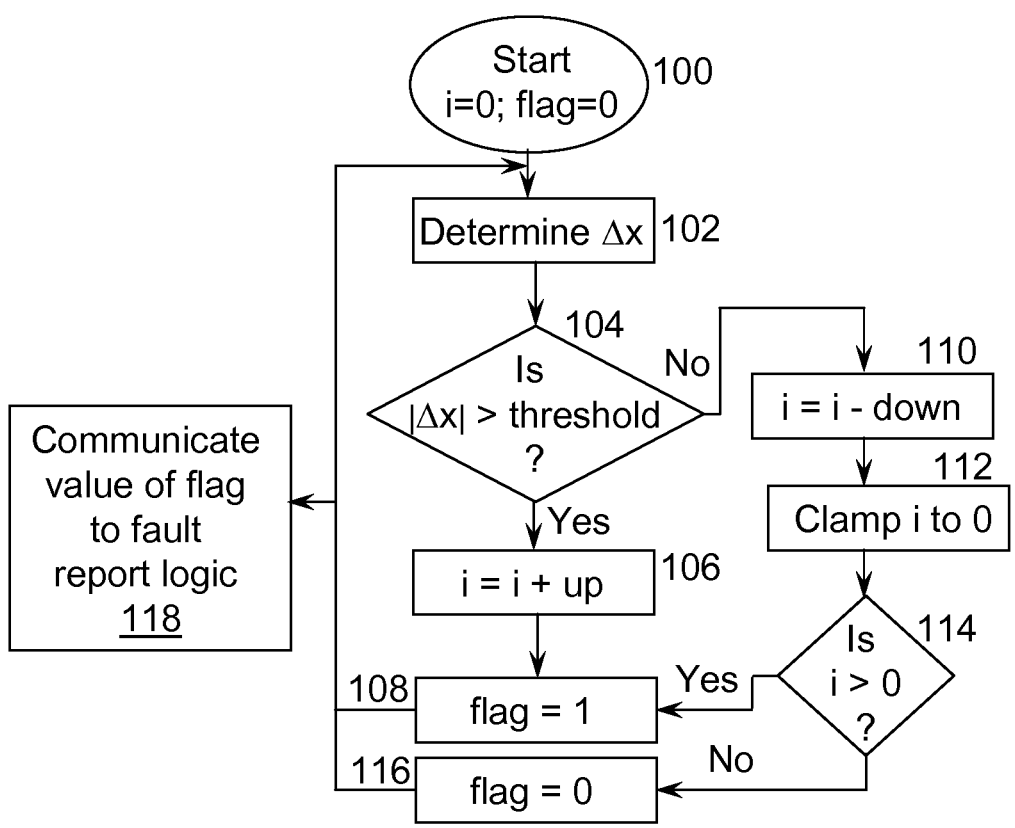
FIG. 3 is a flowchart illustrating embodiments of the present disclosure.

In FIG. 3, an example of a transient detection algorithm is shown in a flowchart form. The transient detection algorithm is conducted in conjunction with the diagnostic routine, the latter not being part of the present disclosure. The algorithm starts in 100 and the counter, i, is set to zero. In 102, $\Delta x$ is determined, where $\Delta x=(x1-x0)$, i.e., the difference between the value of x at the present time, 1, and the value of x at prior time, 0. The variable, x, can be any parameter associated with the electric machine on which a diagnostic routine may be conducted. A non-limiting list of parameters includes: current, voltage, motor torque, rotational speed, any other suitable parameter, and any combination thereof. In 104, the absolute value of $\Delta x$, $|\Delta x|$, is compared to a threshold. If $|\Delta x|$ is greater than the threshold, a transient condition is detected and control passes to 106 in which the counter, i, is incremented by the value of an up counter, up. In an alternative embodiment, the log of $|\Delta x|$ is compared to a threshold. Control then passes to 108 in which a flag is set to 1 indicating that the electric machine is undergoing a transient of sufficient magnitude, i.e., by exceeding the threshold, that diagnostic routines may be providing erroneous results. If it is found in 104 that $\Delta x$ is less than the threshold value, control passes to 110 in which the counter is decremented by the value of a down counter, down. Control passes to 112 in which counter is clamped to zero. That is, if i<0, then i is set to zero so that it is not negative upon returning to block 102, i.e., ensure that i is not negative. Control passes from block 110 to block 112 in which it is determined whether i is greater than zero. If i>0, control passes to block 108 to set (or retain) the value of flag to one. If a negative result in block 114, control passes to block 116 in which the flag is set to zero. From both blocks 108 and 116, control is passed back to block 102 to conduct the routine again. The value of flag is made available to fault report logic in block 118.

In the algorithm described in regards to FIG. 3, an underlying assumption is that the values of x are determined at regular intervals so that the time between measurements of x is constant. This would be consistent in the environment in which computations are clocked at a particular interval, e.g., 50 msec. If, however, the computation steps are irregular, in block 102, $\Delta x/\Delta t$ would be determined instead. The values of the threshold and the up and down counters are adjusted accordingly.

In one embodiment, the up counter is set to a higher value than the down counter so that the flag continues to be set for one or more computation steps beyond when the transient has passed.

Sample data illustrating one embodiment of the disclosure is shown in FIGS. 4a-d. In FIG. 4a, the value of x is shown for 25 samples in which the value of x is determined. In FIG. 4b, $\Delta x$ is determined. In the present example, the value of the threshold is 5. The first time that the absolute value of $\Delta x$ exceeds the threshold is at step 8. In the present example, up is set to five. Thus, the value of the counter at step 8, as shown in FIG. 4c, is 5. The counter is incremented to 10 and 15 in the next two steps, until it retreats by 3, the value of down, in step 11. The transient is no longer evident after step 16 in FIG. 4b. However, according to this set of values for the threshold, up, and down, the value of counter i at step 16 is 13. It takes five additional time steps until the counter is back to zero at step 21. This extended duration helps to ensure that the transient has truly passed. The value of the flag is shown in FIG. 4d, with the flag equal to one when counter i is positive and the flag equal to zero when counter i is zero.

In the example shown in FIGS. 4a-d, all the values are integers, as might be the case for analog counts as used in an analog-to-digital converter. The present disclosure applies equally to real number values. The values of the up and down counts as well as threshold(s) may also be real numbers. In another embodiment, $\Delta x$ is the log of the absolute value of (x1−x0). By taking the log of the difference, at higher levels of x, the transient must be greater to be flagged as such and at lower levels of x, a smaller transient is flagged. Taking the log is one example of a transfer function that could be used in place of a difference in x1 and x0. Alternatively, any suitable function can be employed: $\Delta x=$function (x1, x0).

While the best mode has been described in detail, those familiar with the art will recognize various alternative designs and embodiments within the scope of the following claims. Where one or more embodiments have been described as providing advantages or being preferred over other embodiments and/or over prior art in regard to one or more desired characteristics, one of ordinary skill in the art will recognize that compromises may be made among various features to achieve desired system attributes, which may depend on the specific application or implementation. These attributes include, but are not limited to: cost, strength, durability, life cycle cost, marketability, appearance, packaging, size, serviceability, weight, manufacturability, ease of assembly, etc. The embodiments described as being less desirable relative to other embodiments with respect to one or more characteristics are not outside the scope of the disclosure as claimed.

What is claimed:

1. An electric machine system, comprising:
an electric machine; and
an electronic control unit (ECU) receiving electric machine signals and altering a response of a diagnostic routine during a transient condition associated with a counter exceeding zero, the ECU incrementing the counter a first amount and decrementing the counter a second amount in response to a change in the electric machine signals exceeding and not exceeding an associated threshold, respectively.

2. The electric machine system of claim 1 wherein the diagnostic routine compares a commanded value of a quantity with an actual value of the quantity and the quantity is one of a current, a voltage, a torque, and a speed.

3. The electric machine system of claim 1, the ECU incrementing the counter by the first amount in response to magnitude of the change in the electric machine signals exceeding the associated threshold, and decrementing the counter by the second amount in response to the magnitude of the change in the electric machine signals not exceeding the associated threshold.

4. A system for an electric machine, comprising:
a controller configured to control the electric machine in response to a counter exceeding a predetermined value for a predetermined period of time, the controller incrementing the counter by a first value and decrementing the counter by a second value less than the first value in response to magnitude of a change in an electric machine signal exceeding or not exceeding, respectively, a threshold.

5. The system of claim 4 wherein the electric machine signal comprises an electric machine current, voltage, or speed signal.

6. The system of claim 4 wherein the controller limits the counter to a lowest value of zero.

7. The system of claim 4, the controller generating a diagnostic flag when the counter exceeds the predetermined value.

8. The system of claim 4, the controller shutting down the electric machine in response to the counter exceeding the predetermined value for the predetermined period of time.

9. A system for detecting a transient condition, comprising:
an electric machine; and
an electronic control unit (ECU) that controls the electric machine based on a counter exceeding a predetermined value, the ECU incrementing and decrementing the counter by first and second amounts, respectively, unless decrementing the counter would result in a value below the predetermined value, in response to a magnitude of rate of change in an electric machine signal relative to a threshold.

10. The system of claim 9 wherein the first amount exceeds the second amount.

11. The system of claim 9 wherein the electric machine signal comprises one of a current, voltage, or speed signal.

12. The system of claim 9 further comprising:
a battery; and
a generator, wherein the electric machine is operating as a motor to which current is supplied from at least one of the battery and the generator.

13. The system of claim 9, the ECU incrementing the counter by the first amount in response to the magnitude of the rate of change in the signal exceeding the threshold, and decrementing the counter by the second amount in response to the magnitude of the rate of change in the signal not exceeding the threshold.

* * * * *